United States Patent [19]

Chau

[11] Patent Number: 4,755,805
[45] Date of Patent: Jul. 5, 1988

[54] CURRENT SENSING ALARM ARRANGEMENT FOR MONITORING THE PRESENCE OF HIGH VOLTAGE

[75] Inventor: Albert W. Chau, Redmond, Wash.

[73] Assignee: FlowMole Corporation, Kent, Wash.

[21] Appl. No.: 866,170

[22] Filed: May 22, 1986

[51] Int. Cl.[4] .............................................. G08B 21/00
[52] U.S. Cl. .................................... 340/662; 340/649; 340/660; 361/91
[58] Field of Search ............... 340/662, 679, 684, 685, 340/649, 660, 651; 361/91

[56] References Cited

U.S. PATENT DOCUMENTS

| | | | |
|---|---|---|---|
| 3,141,156 | 7/1964 | Fredman et al. | 340/660 |
| 3,831,160 | 8/1974 | Cronin et al. | 340/649 X |
| 3,943,409 | 3/1976 | Brown | 340/651 X |

*Primary Examiner*—Joseph A. Orsino
*Assistant Examiner*—Jeffery A. Hofsass
*Attorney, Agent, or Firm*—Flehr, Hohbach, Test, Albritton & Herbert

[57] ABSTRACT

A system in which an electrically conductive boring device is caused to move through the ground to provide an underground tunnel, to install underground utilities, or for any other reason. A technique for detecting if the boring device electrically engages an underground source of high voltage such as an existing underground utility line. This arrangement, is also suitable for detecting if other electrically conductive apparatus, structural member, or like means engages a similar underground source of high voltage includes means defining an electrically conductive path leading from the boring device or other such member to a grounding point sufficient to reduce to a negligible level any high voltage to which the device or like member may be subjected. The present technique monitors the current through the grounding path and indicates if the current level through the path reaches a predetermined threshold level which is selected to correspond with the presence of high voltage.

2 Claims, 2 Drawing Sheets

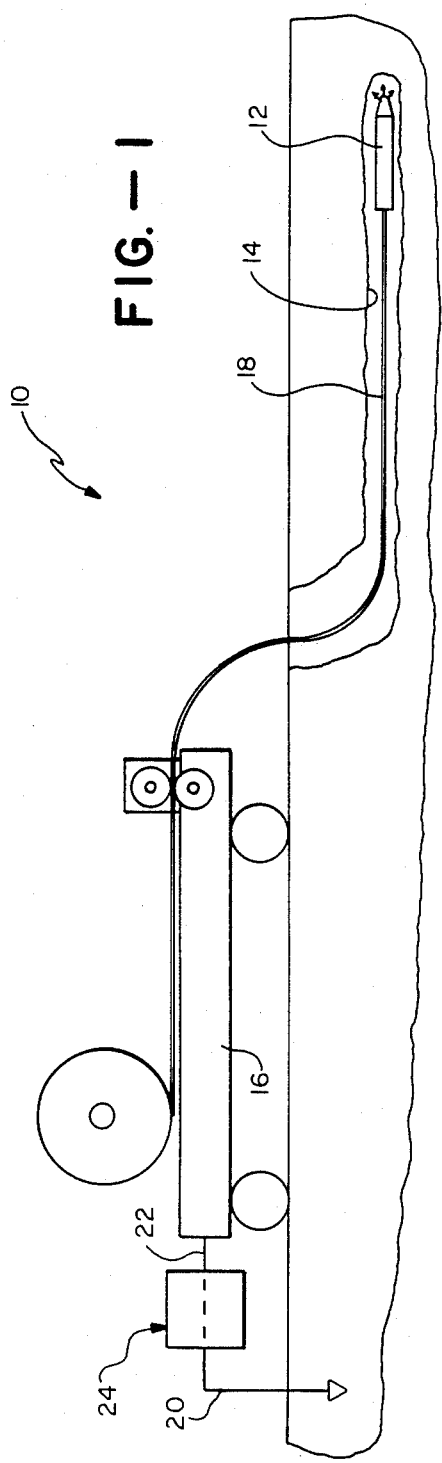
FIG.—1
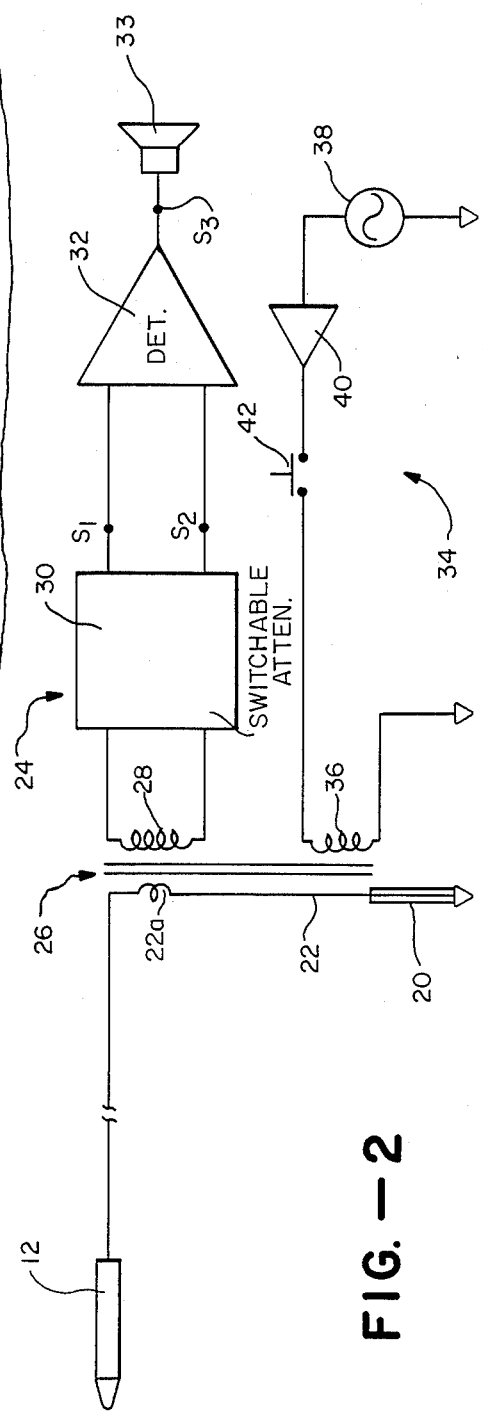
FIG.—2

4,755,805

CURRENT SENSING ALARM ARRANGEMENT FOR MONITORING THE PRESENCE OF HIGH VOLTAGE

The present invention relates generally to a technique for monitoring the presence of high voltage and more particularly to a specific technique for monitoring the presence of high voltage in a system which utilizes an electrically conductive boring device to move through the ground in order to provide an underground tunnel, to install underground utilities or for any other reason.

The present invention is particularly relevant to co-pending U.S. Pat. patent application Ser. No. 866,240, filed May 22, 1986 and entitled TECHNIQUE FOR PROVIDING AN UNDERGROUND TUNNEL UTILIZING A POWERED BORING DEVICE. In that application, which is incorporated herein by reference, an overall system for providing a continuous underground tunnel is disclosed. This system utilizes a discrete, elongated boring device which is moved through the ground by means of a thrust conduit which is connected at one end of the boring device and at an opposite end to a reel supported on an above ground platform that also supports a conduit thrust assembly, means for controlling the boring device and an operator. It should be apparent that as the boring device moves through the soil it may possibly engage an underground utility line or other such source of high voltage. In order to protect the systems controls and the operator on the platform in the event of such a possibility, both the boring device and the platform must be sufficiently grounded to eliminate any high voltage which might otherwise result. While this may be readily accomplished utilizing, for example, sufficiently large grounding rods, plates or the like, it does not warn the operator that such a condition exists. Therefore, should the boring device be in contact with a high voltage line, for example, while an operator knowingly or inadvertently disconnects the system from ground he could place himself in serious jeopardy.

In view of the foregoing, it is an object of the present invention to provide a technique for adequately grounding the above recited boring device, platforms and associated components or any other electrically conductive apparatus, support member or like means, while at the same time providing a technique for detecting if the device or like means is in contact with a source of high voltage.

Another object of the present invention is to provide a technique of the last mentioned type which is uncomplicated and reliable while, at the same time, being economical to provide and convenient to use.

Still another object of the present invention is to provide an arrangement for carrying out the above recited technique, which arrangement for the most part is sufficiently portable to be carried around from one job site to another.

As will be described in more detail hereinafter, the particular technique disclosed herein is one which monitors current through the ground path of the device or system in question and provides an audio and/or visual indication if the current level in the path reaches a predetermined threshold level corresponding to the presence of a grounded high voltage source. Note that the present technique detects for current and not voltage. This is because there would be virtually no voltage present if the device, system or like means is adequately grounded.

The present technique will be described in more detail below in conjunction with the drawings wherein:

FIG. 1 is a diagrammatic illustration of an overall system including an electrically conductive boring device to provide an underground tunnel, to install underground utilities or for any other reason;

FIG. 2 illustrates, in part diagrammatically and in part schematically, an arrangement for detecting if the boring device illustrated in FIG. 1 electrically engages an underground source of high voltage such as an existing underground utility line.

Figure 3:
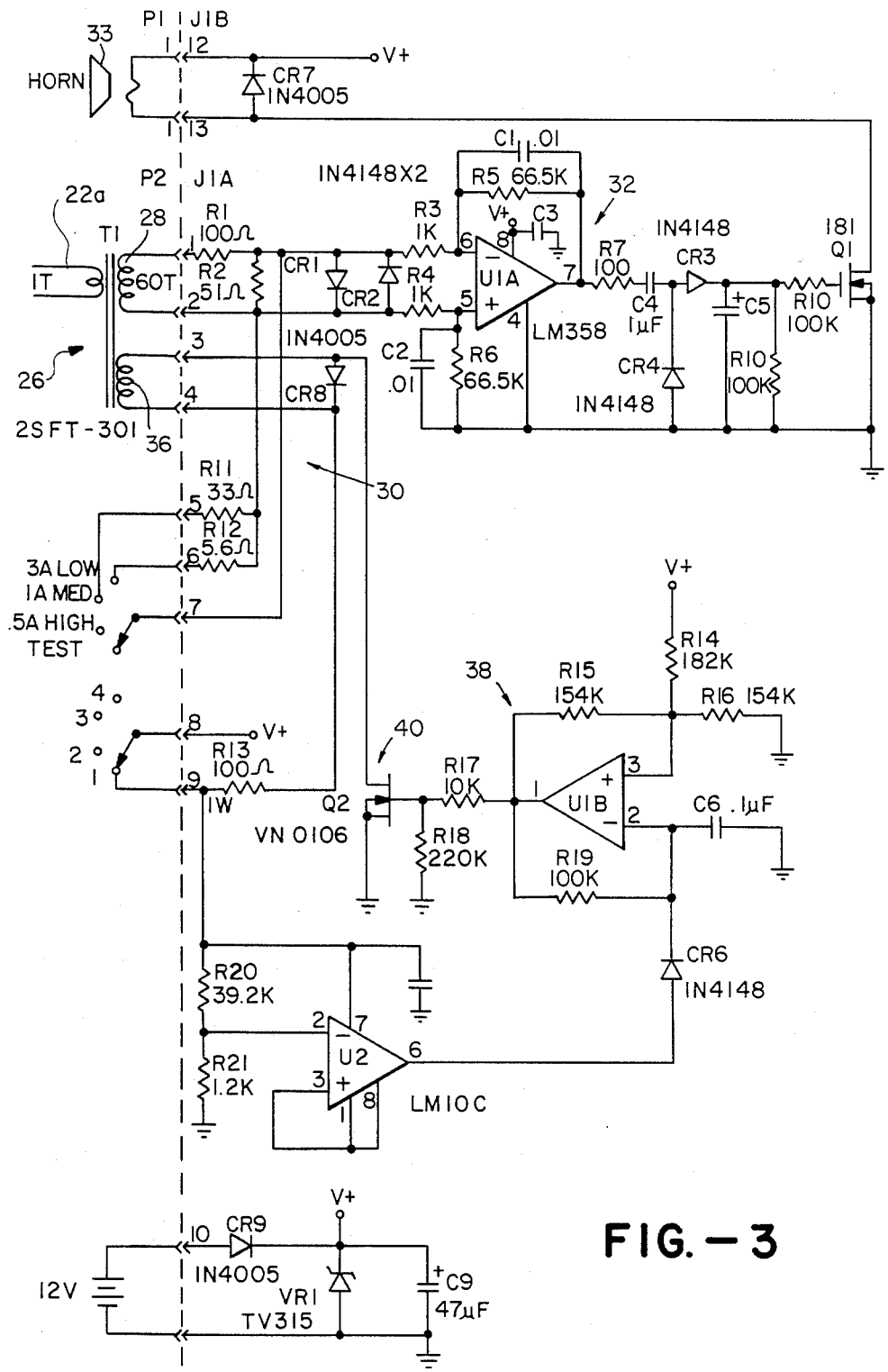
FIG. 3 is a schematic illustration of an actual working embodiment of certain components forming part of the overall arrangement shown in FIG. 2.

Turning now to the drawings, attention is first directed to FIG. 1 which, as indicated above, illustrates a system including an electrically conductive boring device to provide an underground tunnel, to install underground utilities or for any other reason. The overall system is generally indicated at 10. The boring device is shown at 12 and the tunnel is designated by the reference numeral 14. The system is also shown including a trailer 16 serving as an operator's platform and a thrust conduit 18. While not shown entirely, means are provided on the platform or trailer in cooperation with the thrust conduit for controlling the boring device as it moves through the soil.

Still referring to FIG. 1, a ground rod 20 or other suitable grounding means is provided for grounding various components making up system 10 including specifically trailer 16 and boring device 12 in the event the latter inadvertently engages a source of high voltage such as a power line. In this regard, a suitable ground cable or cables extend from the boring device to the trailer, thereby providing a continuous ground path from the boring device to ground rod 12 and cable 22. The ground path is made sufficiently conductive to reduce any high voltage to which the boring device 12 may be subjected to at most a negligible level. Thus, should the boring device actually engage a high voltage source, the voltage will not appear across system 10. Rather the grounding network will provide a current path from the engaged voltage source through the boring device, trailer 16 eventually into and through cable 22 and ground rod 20 to ground. As will be described immediately below, an arrangement 24 is provided in accordance with the present invention for monitoring the current through this ground path in order to indicate the presence or absence of a high voltage source.

Turning now to FIG. 2, arrangement 10 is shown in more detail in conjunction with boring device 12 and the grounding network including specifically ground rod 20 and grounding cable 22. In an actual working embodiment, grounding cable 22 is a 1/0 cable which, as will be seen, forms part of overall arrangement 24. This arrangement includes a suitable transformer 26 which serves to sense any current passing through cable 22. In this regard, an integral or continuous section 22a of the cable serves as the primary winding for the transformer which includes its own secondary winding 28. By incorporating the cable into the transformer or, stated the other way, by incorporating the transformer into the cable, there is no need to provide a break in the cable for installing a monitoring system. Breaks could result in unreliable operation. The current passing through cable 22 causes a proportionate amount of current to be induced in secondary 28. The exact amount of current so induced depends upon the design of the transformer. In an actual working embodiment, the current ratio between the primary and secondary is 60:1.

Still referring to FIG. 2, the current signal induced in secondary winding 28 of transformer 26 by current passing through cable 22 is processed by attenuator circuit 30 so as to eliminate noise and other unwanted signal components and is thereafter applied to an output terminal S1. At the same time, the circuitry making up attenuator 30 supplies a signal which is amplitude adjustable and which serves as a reference signal, as will be seen. The outputs S1 and S2 are connected to the two inputs of differential amplifier 32 which serves as a threshold detector. This detector functions in the following manner. So long as the amplitude of the signal at the S1 input to the detector is at or below the amplitude of the reference signal input S2, the output S3 of the detector is zero. If the amplitude of the S1 signal rises above the amplitude of the reference signal, it turns the detector on, that is, it produces an output signal at S3 which serves as an alarm drive signal. Output S3 is, in turn, connected to an audio alarm 33 and/or a visual indicator (not shown) for driving either or both.

With overall arrangement 24 described thus far, attention will now be directed to the manner in which this arrangement detects whether or not boring device 12 is in engagement with a high voltage source. To this end, the switchable attenuator 30 can be used to adjust the sensitivity of the overall arrangement by appropriately selecting the desired amplitude of the reference signal at its output S2. With that in mind, so long as boring device 12 does not engage a high voltage source, any currents through the ground path and specifically through grounding cable 22 will be relatively small and, in any event, sufficiently small so as to result in a signal at S1 which does not exceed the reference signal at S2. On the otherhand, should the boring device engage a source of high voltage, a relatively large current will pass through grounding cable 22 and thereby result in a signal at S1 exceeding the reference signal at S2 and thereby cause the detector 32 to produce its alarm drive signal at S3.

From the foregoing, it should be apparent that arrangement 24 as described thus far is capable of continuously apprising an operator on or around trailer 16 whether or not the trailer and the trailer's grounding network are connected in circuit with a high voltage source, thereby warning the operator not to disconnect or otherwise tamper with the grounding network if, in fact, a high voltage source is present. While arrangement 24 is particularly suitable for this purpose, it is to be understood that the arrangement can be utilized to monitor other types of grounding systems in the same way. Also, it is to be understood that the circuitry described in conjunction with FIG. 2 has been provided for exemplary purposes only and that any suitable circuitry capable of carrying out the described functions of arrangement 24 can be readily provided. FIG. 3 schematically illustrates an actual working embodiment of arrangement 24 including a testing circuit 34 to be described below.

In order to insure that overall monitoring arrangement 24 is functioning properly at any given time, the arrangement may include the previously mentioned test circuit 34. As shown in FIG. 2, this circuit includes its own secondary winding 36 which forms part of transformer 26. A suitable current source 38, for example an oscillator, is provided for generating a current signal which is processed through suitable processing circuitry 40 and applied across secondary winding 36 by means of a suitable actuator, for example a button 42. The current so provided is specifically selected so that it induces a current in cable 22 which simulates the current that would be produced if boring device 12 engaged a high voltage source. This simulated current signal is then sensed by transformer secondary 28 and processed through circuitry 30 and 32 in order to drive alarm 33 and/or a visual indicator if the arrangement is in working order.

In an actual working embodiment, overall arrangement 24 is relatively small and readily portable and can be operated by battery. In that way, it can be taken to a job site and easily connected across an existing grounding cable or a compatible grounding cable can first be provided and then interconnected with the arrangement. The actual working unit is powered by a 12 V battery (alkaline), the current drawn by the circuit is less than 0.001 amp in the standby mode, that is, when the alarm is not sounding. In normal application, the battery should last more than a year. Thus, an on/off switch for the device is not required. This eliminates the possibility that the device is left in the power off mode. Actual working circuitry for arrangement 24 is illustrated in Figure three including cable section 22a, and secondaries 28, 36 forming transformer 26 and alarm (horn) 33. U1A is connected as a differential amplifier, with input diode clamp for input protection. C4, C5, CR3 and CR4 are connected as charge pump, for level shifting and driving Q1. U1B is connected as an oscillator for driving Q2, this would force current through the test coil for alarm testing purposes. U2 is a low power voltage reference, if the voltage output from the battery drops below 6.7 V, the operating threshold of the horn, the output on U2 will go high and forward bias CR6, thus shutting off the oscillator. The rest of the circuitry is self explanatory in view of the the teachings herein.

What is claimed is:

1. An arrangement for detecting if an electrically conductive apparatus, structural member or the like may be inadvertently electrically connected to a source of high voltage, said arrangement comprising:
   (a) means including a continuous electrically conductive ground cable defining an electrical ground path from said apparatus, structural member or the like to a grounding point, said ground path defining means being sufficiently conductive to reduce to at most a negligible level any high voltage to which the apparatus, structural member or the like may be subjected; and
   (b) means for monitoring the current through said ground path and for indicating if the current level so monitored reaches a predetermined threshold level sufficiently high to indicate that the apparatus, structural member or the like is in electrical engagement with a source of high voltage, said monitoring means including means for directly sensing the current in said ground path and for producing a corresponding electrical signal, and means for comparing the magnitude of said signal to a reference signal serving as said threshold level, said current sensing means including transformer means which utilizes a section of said ground cable as a primary and which includes a secondary, whereby current carried by said ground cable is induced in and sensed by said secondary to produce said corresponding signal, said monitoring means including means for directly sensing the current in said ground path and for producing a corresponding electrical signal, means for comparing the magnitude of said corresponding signal to a reference signal serving as said threshold level, means for producing an alarm driving signal in the event that a current exceeding said threshold level is sensed, and an alarm responsive to said alarm signal for producing an audible and/or visual signal, said arrangement also including means for testing said monitoring means, said testing means including means for producing an oscillating signal, a transformer secondary forming part of said transformer means for simulating a fault current on said electrically conductive cable by means of induction through said transformer, whereby said simulated current is sensed by said first mentioned secondary forming part of said transformer means.

2. An arrangement according to claim 1 wherein said apparatus, structural member or the like includes an electrically conductive boring device which is caused to move through the ground to provide an underground tunnel, to install underground utilities and for any other reason, and an electrically conductive platform which is located above the ground for supporting controls for the boring device and an operator, and wherein said grounding path includes aid boring device, platform and electrically conductive cable means between the two.

* * * * *